(12) United States Patent
Noguchi et al.

(10) Patent No.: US 6,528,725 B2
(45) Date of Patent: Mar. 4, 2003

(54) PORTABLE ELECTRONIC DEVICE

(75) Inventors: Kouichi Noguchi, Chiba (JP); Katsunobu Iguchi, Chiba (JP); Takashi Ito, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/015,401

(22) Filed: Dec. 12, 2001

(65) Prior Publication Data

US 2002/0088636 A1 Jul. 11, 2002

(30) Foreign Application Priority Data

Dec. 27, 2000 (JP) ........................................ 2000-398986

(51) Int. Cl.[7] ................................................ H02G 3/18
(52) U.S. Cl. ................................ 174/65 G; 174/65 SS; 16/2.2; 248/56
(58) Field of Search ............................ 174/65 G, 65 SS, 174/152 G, 153 G, 135, 151; 248/56; 16/2.1, 2.2

(56) References Cited

U.S. PATENT DOCUMENTS

| | | | | |
|---|---|---|---|---|
| 4,375,011 A | * | 2/1983 | Grunau | 174/65 SS |
| 5,763,832 A | * | 6/1998 | Anselm | 174/135 X |
| 6,069,316 A | * | 5/2000 | Utke | 174/65 G |
| 6,150,607 A | * | 11/2000 | Weyl et al. | 174/65 G |
| 6,184,467 B1 | * | 2/2001 | Milanowski et al. | 16/2.1 |
| 6,444,908 B1 | * | 9/2002 | Krall | 174/65 G |

* cited by examiner

Primary Examiner—Dean A. Reichard
Assistant Examiner—Dhiru R Patel
(74) Attorney, Agent, or Firm—Adams & Wilks

(57) ABSTRACT

To provide electronic device, which is easily assembled and disassembled. A cup-shaped introduction tube made of a rubber type member is inserted in an introduction hole provided in a watch case. On an outer peripheral surface of the introduction tube, a convex portion having a uniform semi-arch shape in cross-section in an axial direction is integrally formed. A metal pipe is inserted into the introduction tube, and an outer diameter of the metal pipe and an inner diameter of the introduction tube have a relationship of close fit before insertion. Furthermore, at an end portion of the metal pipe, a brim-shaped edge portion is formed. A ring groove is formed on a cup bottom surface of the introduction tube. In the ring groove, an annular O-ring made of a rubber type member is sandwiched. The O-ring has substantially the same inner diameter as the diameter of a shield line, and the O-ring forms a seal surface among the shield line, the metal pipe, and the ring groove in a crushed state. Furthermore, the shield line is inserted in the watch case while passing through the introduction tube, the rigid pipe, and the O-ring.

7 Claims, 5 Drawing Sheets

PORTABLE ELECTRONIC DEVICE

BACKGROUND OF THE INVENTION

1. Field of the Invention

The present invention relates to portable electronic device having a waterproofing function.

2. Description of the Prior Art

It is currently known that electric modules such as a battery and a control button are disposed outside of a housing such as a watch case in conventional portable electronic device. Furthermore, in electronic device used for portable purposes, such as a watch and a mobile phone, it is required to ensure a predetermined waterproofing function in accordance with the use and function. As such a waterproofing structure of portable device, a technique described in Japanese Patent Application Laid-open No. 2000-284070 is known.

FIG. 3 is a side view showing an entire waterproofing structure of a watch of the prior art. In FIG. 3, a watch 1 includes a watch case 2 and a wrist band 3. A movement 4 and a battery 5 are respectively provided in the watch case 2 and the wrist band 3. The movement 4 and the battery 5 are electrically connected to each other via a shield line 6 provided in the wrist band 3.

FIGS. 4 and 5 are a cross-sectional side view and a cross-sectional plan view showing the vicinity of a hinge portion 7 of the watch 1 shown in FIG. 3. In the watch case 1, an introduction hole 8 for introducing the shield line 6 is provided. In the introduction hole 8, an introduction tube 9 for introducing the shield line 6 is provided, and the shield line 6 is held by a pin 10 inserted in the introduction tube 9. The shield line 6 electrically connects the movement 4 in the watch case to the battery 5 through the introduction tube 9. Furthermore, a gap between the shield line 6 and an inner wall of the introduction tube 9 is sealed with a stopper 11 made of a silicon rubber or the like. Furthermore, a groove 12 is formed on an outer peripheral side portion of the introduction tube 9, and an annular packing 13 is fitted in the groove 12.

However, in the above-mentioned conventional portable electronic device, the shield line is fixed by filling the gap with a silicon rubber. Therefore, there is a problem in that it takes a predetermined time for curing the silicon rubber, and takes a considerable time for assembly. Furthermore, there is a problem in that by fixing the shield line with the stopper 11, maintenance such as repair and exchange of components becomes difficult.

SUMMARY OF THE INVENTION

The present invention has been made in view of the above, and an object is therefore to provide electronic device that can be easily assembled and disassembled.

The present invention relates to a portable electronic device, comprising:

a conductor for electrically connecting an external module provided outside of a housing to an internal module provided in the housing;

an introduction hole provided in the housing, for introducing the conductor into the housing;

an introduction tube made from an elastic member and having a sealing member on an outer peripheral surface thereof, which is introduced into the introduction hole; and a rigid pipe made of a rigid member and having an outer diameter with a relationship of close fit with respect to the introduction tube, which is inserted into the introduction tube while allowing the conductor to pass therethrough.

The rigid pipe has a relationship of close fit in a size before insertion with respect to the introduction tube. Therefore, the outer diameter of the introduction tube is enlarged by inserting the rigid pipe into the introduction tube. Because of this, the sealing member provided on an outer peripheral surface of the introduction tube is biased to the inner wall of the introduction hole, whereby a gap between the introduction hole and the introduction tube is sealed. On the other hand, by pulling out the rigid pipe, the introduction tube made of an elastic member returns to an original shape, whereby sealing is eliminated. Thus, an assembly operation and a disassembly operation of a waterproofing structure can be easily conducted. According to the present invention, the introduction tube has a cup shape, and the portable electronic device has annular packing disposed on a cup-shaped bottom surface in the introduction tube.

By inserting the rigid pipe into the introduction tube, the outer diameter of the introduction tube is enlarged, and the sealing member is biased to the inner surface of the introduction tube, similarly to the case of the above. Furthermore, when the rigid pipe is inserted, the end portion thereof is biased to the packing disposed on a cup bottom surface of the introduction tube, and a gap between the conductor and the introduction tube is sealed. On the other hand, by pulling out the rigid pipe, the introduction tube made of an elastic member returns to an original shape, and sealing between the introduction hole and the introduction tube is eliminated. Simultaneously, sealing between the conductive means and the introduction tube is also eliminated. Thus, an assembly operation and a disassembly operation of a waterproofing structure can be easily conducted.

The present invention relates to portable electronic device in which the sealing member is a rib-shaped convex portion formed integrally with the introduction tube body on an outer peripheral surface of the introduction tube. The rib-shaped convex portion is biased and elastically compressed to the inner wall of the introduction tube due to the insertion of the rigid pipe, and seals a gap between the introduction hole and the introduction tube.

The present invention relates to portable electronic device in which the rigid pipe has a brim-shaped edge portion on an opening side of the introduction tube. The brim-shaped edge portion functions as a surface portion receiving an outer force and prevents the rigid pipe from being excessively inserted into the introduction tube, when the rigid pipe is inserted in the introduction tube.

BRIEF DESCRIPTION OF THE SEVERAL VIEWS OF THE DRAWINGS

A preferred form of the present invention is illustrated in the accompanying drawings in which.

DETAILED DESCRIPTION OF THE PREFERRED EMBODIMENTS

Figure 1:
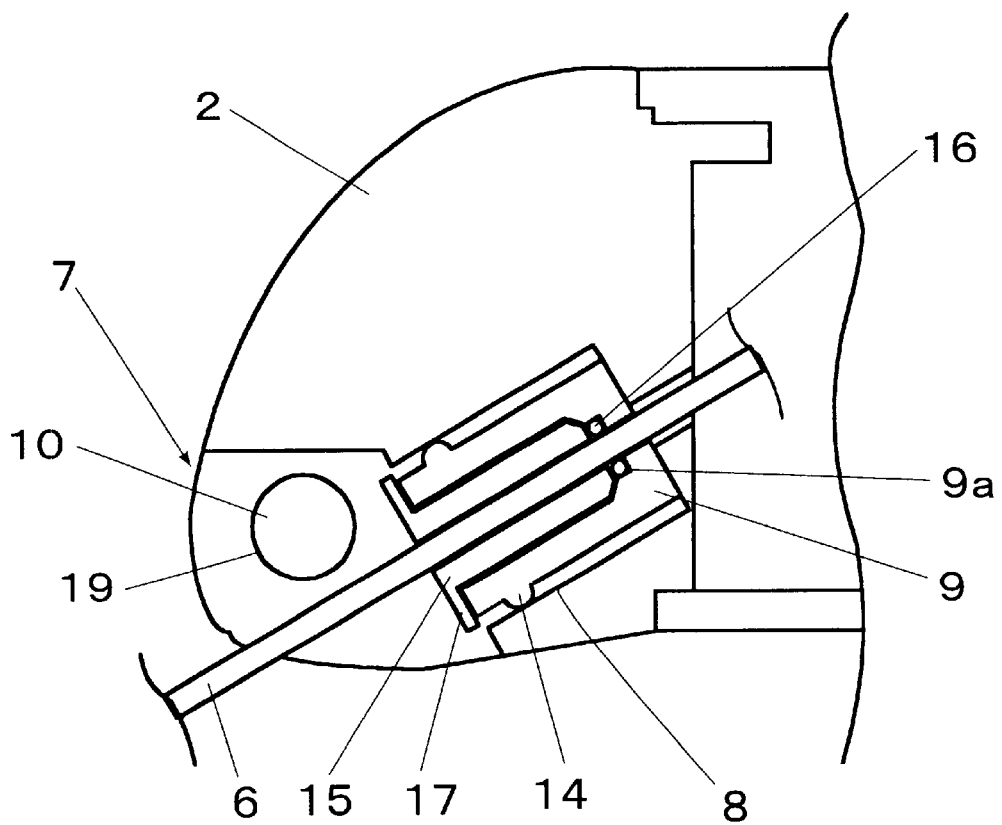
FIG. 1 is a cross-sectional view showing a waterproofing structure of electronic device according to an embodiment of the present invention.

Hereinafter, the present invention will be described in detail with reference to the drawings. The present invention is not limited to the embodiments. Furthermore, the constituent elements of the following embodiments intend to include those which can be generally altered in design by those skilled in the art. FIG. 1 is a cross-sectional view showing a waterproofing structure of electronic device according to an embodiment of the present invention. In FIG. 1, the same constituent elements as those of the conventional waterproofing structure are denoted with the same reference numerals as those therein, and the description thereof will be omitted. A cup-shaped introduction tube 9 made of a rubber type member is inserted in an introduction hole 8 provided in a watch case 2. On an outer peripheral side surface of the introduction tube 9, a sealing member in the form of a convex portion 14, which has a uniform semi-arch shape in cross-section in an axial direction, is integrally formed.

A metal pipe 15 is inserted in the introduction tube 9. An outer diameter of the metal pipe 15 and an inner diameter of the introduction tube 9 have a relationship of close fit before insertion. Furthermore, at an end portion of the metal pipe 15, a brim-shaped edge portion 17 is formed. The edge portion 17 prevents the metal pipe 15 from being inserted in the introduction tube 9 excessively and becoming unlikely to be pulled out therefrom. A ring groove 9a is formed on a cup bottom surface of the introduction tube 9. In the ring groove 9a, an annular packing, such as an annular O-ring 16 made of a rubber type member is sandwiched. The O-ring 16 has substantially the same inner diameter as the diameter of the shield line 6, and the O-ring 16 forms a seal surface among the shield line 6, the metal pipe 15, and the ring groove 9a in a crushed state. Furthermore, the shield line 6 is inserted in the watch case 2 while passing through the introduction tube 9, the rigid pipe 15, and the O-ring 16.

The outer diameter of the introduction tube 9 is enlarged by inserting the metal pipe 15 into the introduction tube 9, and the convex portion 14 on the outer periphery is biased to the inner wall of the introduction hole 8. Because of this, a gap between the side surface portion of the introduction tube 9 and the inner wall of the introduction hole 8 is sealed, and the metal pipe 15 and the introduction tube 9 are fixed in the introduction hole 8. Therefore, unlike the conventional waterproofing structure, it is not required to provide a pin 10 for holding the introduction tube 9. Furthermore, it is not required to provide a through-hole 19 for passing the pin 10. Thus, formation of the introduction tube 9 becomes easy, and assembly of a waterproofing structure is further simplified, compared with the conventional example.

Furthermore, by inserting the metal pipe 15 into the introduction tube 9, the end portion of the metal pipe 15 is biased to the O-ring 16, and a gap between the shield line 6 and the inner wall (groove surface) of the introduction tube 9, and a gap between the introduction tube 9 and the metal pipe 15 are sealed. As a result, the watch case 2 is sealed by one action of inserting the metal pipe 15, so that a cumbersome sealing operation using a silicon rubber and the like required in the conventional waterproofing structure becomes unnecessary. Furthermore, by pulling out the metal pipe 15, each sealed state can be cancelled by one action. Because of this, assembly of the watch becomes easy, thereby enhancing maintenance.

The convex portion 14 is not limited to that formed integrally with the introduction tube 9 as described above, and includes those which can be generally altered in the design by those skilled in the art. For example, as in the conventional waterproofing structure, a groove 13 may be formed on an outer peripheral portion of the introduction tube 9, and an annular packing 12 maybe embedded therein. Furthermore, such convex portions 14 and annular packings 16 may be provided in a plurality of stages (not shown). Furthermore, the convex portion 14 may not have a convex shape which is an externally clear semi-arch as described above, and may have a bulge with a mild slope.

Figure 2:
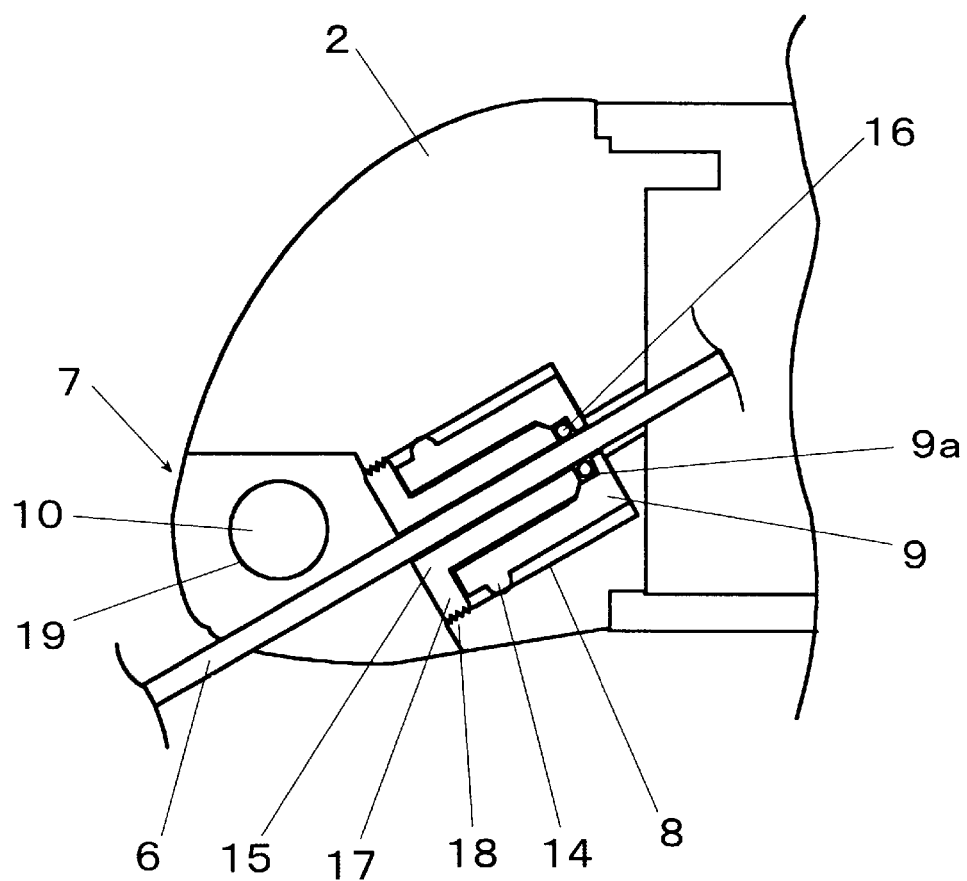
FIG. 2 is a cross-sectional view showing a modified example of the waterproofing structure of the electronic device shown in FIG. 1.
Figure 3:
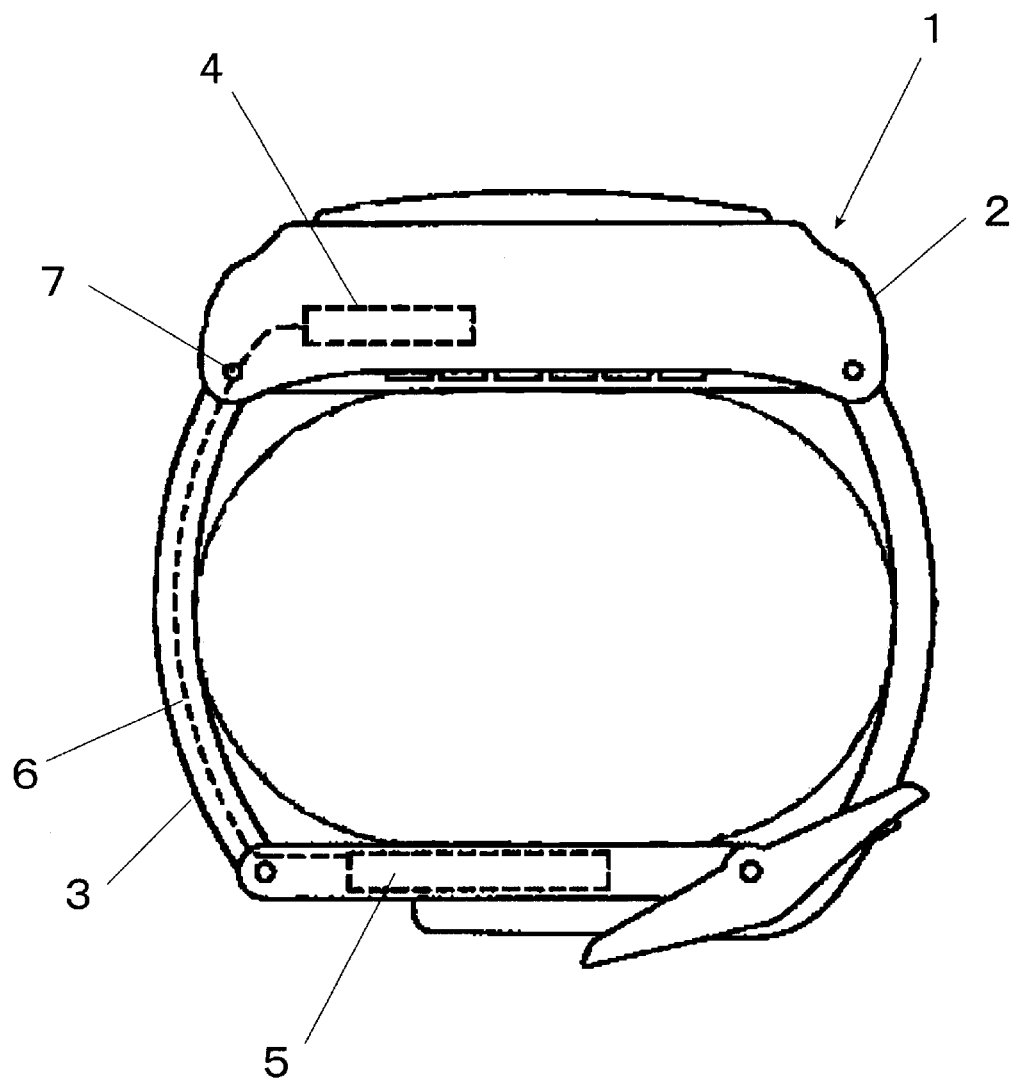
FIG. 3 is a view showing an entire configuration of a waterproofing structure of conventional electronic device.
Figure 4:
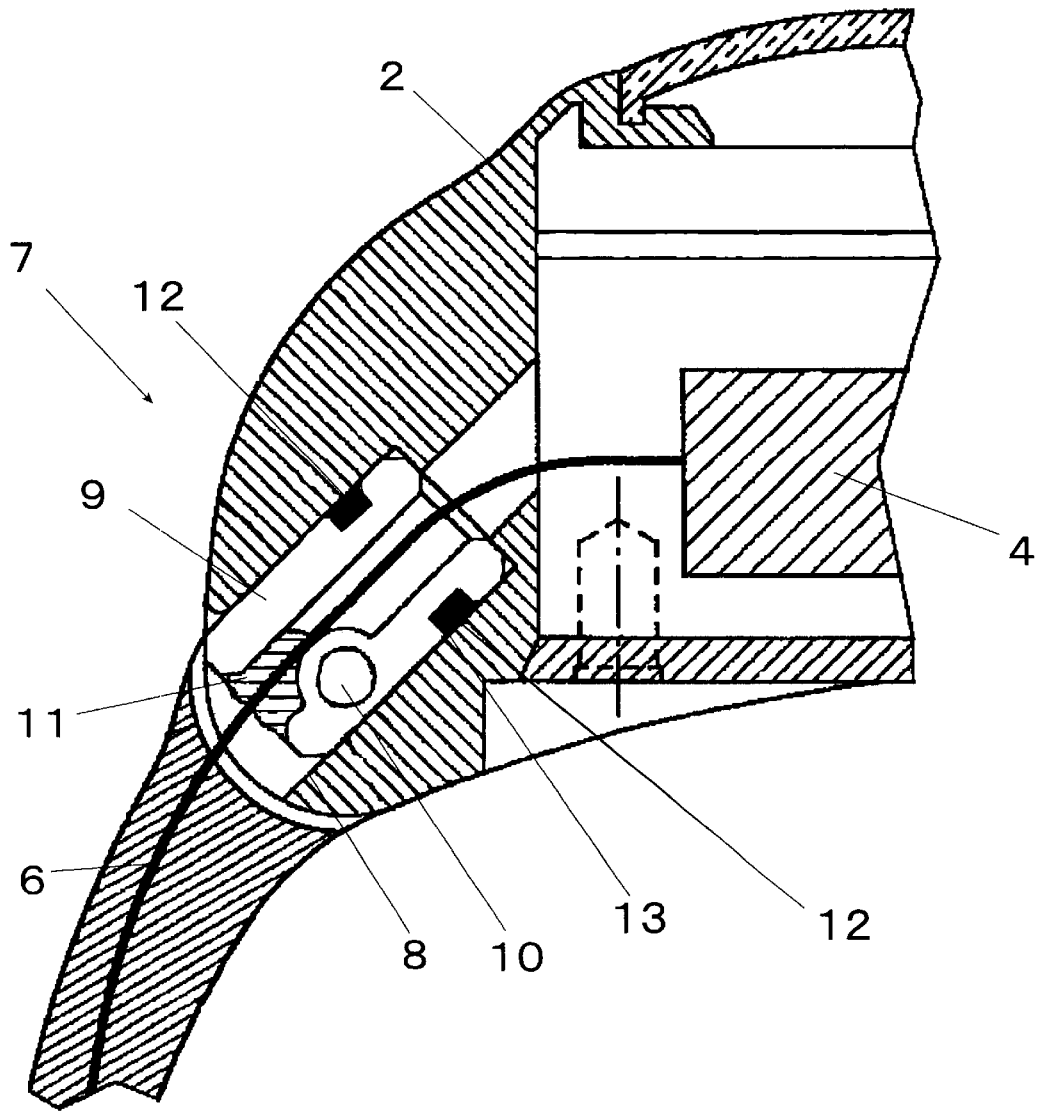
FIG. 4 is a cross-sectional side view showing main portions of the waterproofing structure of electronic device shown in FIG. 3.
Figure 5:
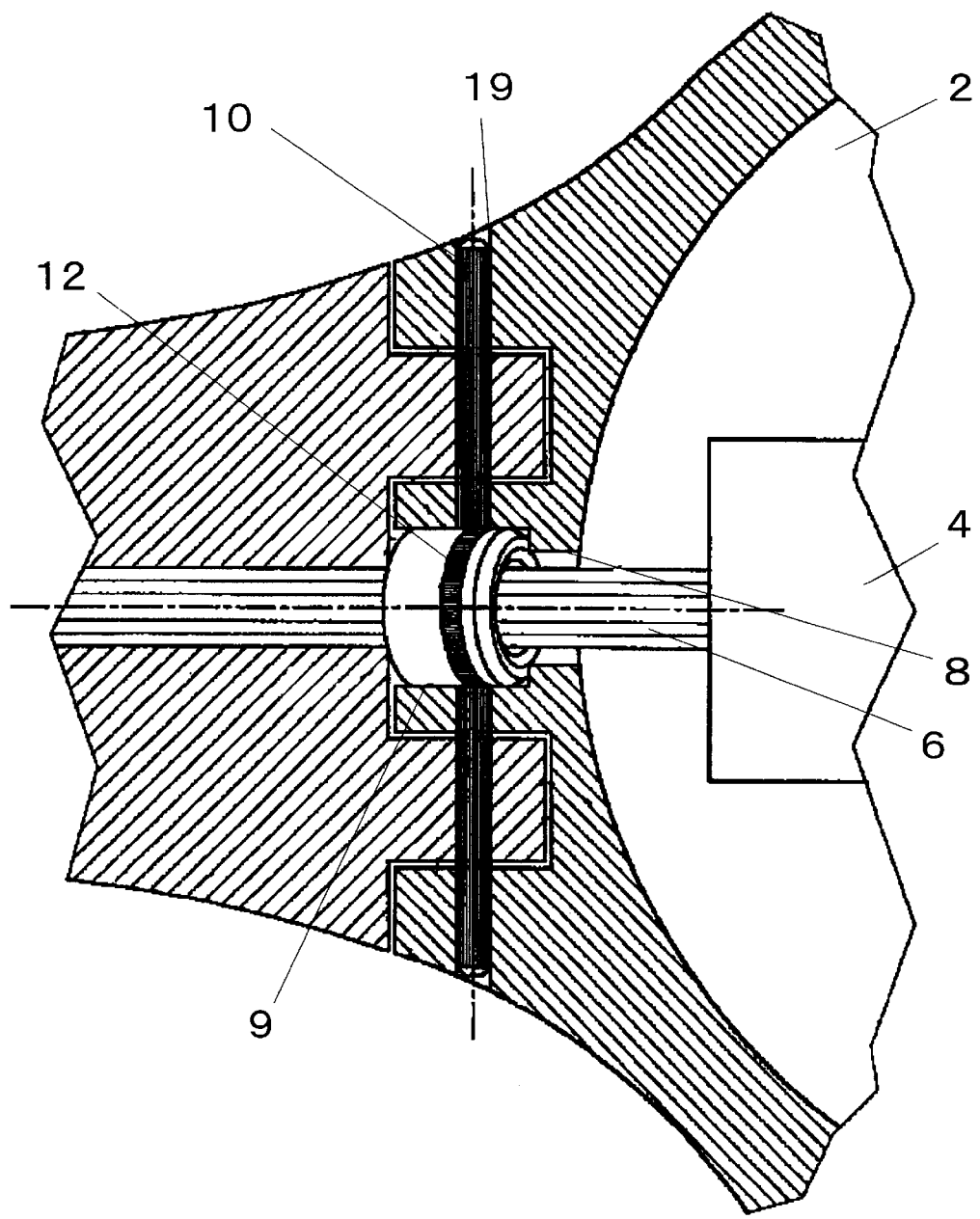
FIG. 5 is a cross-sectional plan view showing the waterproofing structure of electronic device shown in FIG. 4.

Furthermore, as shown in FIG. 2, a threaded portion 18 may be provided at the brim-shaped edge portion 17. Because of this, the introduction tube 9 is held by the metal pipe 15 exactly in the introduction hole 8, and waterproof property can also be enhanced. Furthermore, it is appreciated that the above-mentioned configuration is applicable to a waterproofing structure of portable electronic device such as a mobile phone, a PHS, and a mobile terminal, as well as a watch.

As described above, in the portable electronic device of the present invention, a rigid pipe is inserted into an introduction tube, whereby the outer diameter of the introduction tube is enlarged. Further, a sealing member provided on an outer peripheral surface of the introduction tube is biased to the inner wall of the introduction hole, whereby a gap between the introduction hole and the introduction tube is sealed. Therefore, an assembly operation and a disassembly operation of a waterproofing structure can be easily conducted.

Furthermore, in the portable electronic device according to the present invention, a rigid pipe is inserted into an introduction tube, whereby the outer diameter of the introduction tube is enlarged. Further, a sealing member provided on an outer peripheral surface of the introduction tube is biased to the inner wall of the introduction hole, whereby a gap between the introduction hole and the introduction tube is sealed. Furthermore, the end of the rigid pipe is biased to a packing disposed on a cup bottom surface of the introduction tube, whereby a gap between the conductive means and the introduction tube is sealed. Therefore, an assembly operation and a disassembly operation of a waterproofing structure can be easily conducted, and waterproof property can also be enhanced.

Furthermore, in the portable electronic device according to the present invention, the introduction tube and the convex portion disposed on an outer peripheral surface thereof are integrally formed. Therefore, the number of required components can be reduced, thereby making it easier to conduct an assembly operation.

Furthermore, in the portable electronic device according to the present invention, the brim-shaped edge portion allows a rigid pipe to be easily inserted into the introduction tube, and can prevent the rigid pipe from being excessively inserted into the introduction tube. Therefore, an assembly operation and a disassembly operation of a waterproofing structure can be further facilitated.

What is claimed is:

1. A portable electronic device, comprising:

a conductor for electrically connecting an external module provided outside of a housing to an internal module provided in the housing;

an introduction hole provided in the housing, for introducing the conductor into the housing;

an introduction tube made from an elastic member and having a sealing member on an outer peripheral surface thereof, which is introduced into the introduction hole; and a rigid pipe made of a rigid member and having an outer diameter with a relationship of close fit with respect to the introduction tube and which is inserted into the introduction tube while allowing the conductor to pass therethrough.

2. A portable electronic device according to claim 1, wherein the introduction tube is cup-shaped; and further comprising an annular packing disposed on an inner bottom surface of the introduction tube.

3. A portable electronic device according to claim 2, wherein the sealing member is a rib-shaped convex portion formed integrally with the introduction tube body on the outer peripheral surface of the introduction tube.

4. A portable electronic device according to claim 2, wherein the rigid pipe has a brim-shaped edge portion on an opening side of the introduction tube.

5. A portable electronic device according to claim 1, wherein the sealing member is a rib-shaped convex portion formed integrally with the introduction tube body on the outer peripheral surface of the introduction tube.

6. A portable electronic device according to claim 5, wherein the rigid pipe has a brim-shaped edge portion on an opening side of the introduction tube.

7. A portable electronic device according to claim 1, wherein the rigid pipe has a brim-shaped edge portion on an opening side of the introduction tube.

* * * * *